(12) United States Patent
Nien et al.

(10) Patent No.: US 11,859,302 B2
(45) Date of Patent: Jan. 2, 2024

(54) ELECTROPLATING APPARATUS AND ELECTROPLATING METHOD

(71) Applicant: Unimicron Technology Corp., Taoyuan (TW)

(72) Inventors: Heng-Ming Nien, Taoyuan (TW); Chih-Chiang Lu, Taoyuan (TW); Chih-Kai Chan, Taoyuan (TW); Shih-Lian Cheng, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 93 days.

(21) Appl. No.: 17/705,405

(22) Filed: Mar. 28, 2022

(65) Prior Publication Data

US 2023/0124913 A1 Apr. 20, 2023

Related U.S. Application Data

(60) Provisional application No. 63/255,438, filed on Oct. 14, 2021.

(30) Foreign Application Priority Data

Mar. 16, 2022 (TW) .................................. 111109527

(51) Int. Cl.
*C25D 5/00* (2006.01)
*C25D 21/12* (2006.01)
*H05K 3/18* (2006.01)

(52) U.S. Cl.
CPC ............. *C25D 5/007* (2020.08); *C25D 21/12* (2013.01); *H05K 3/188* (2013.01)

(58) Field of Classification Search
None
See application file for complete search history.

(56) References Cited

U.S. PATENT DOCUMENTS

| 6,669,833 B2* | 12/2003 | Kaja ..................... C25D 17/007 204/224 R |
| 2004/0262150 A1* | 12/2004 | Yajima .................... C25D 7/123 204/224 R |
| 2009/0288954 A1* | 11/2009 | Van Den Bossche ... B23H 1/04 205/52 |
| 2011/0210005 A1* | 9/2011 | Van Den Bossche ....................... C25D 17/001 204/229.4 |

FOREIGN PATENT DOCUMENTS

| CN | 1341166 | 3/2002 |
| CN | 101275267 | 10/2008 |
| CN | 211284593 | 8/2020 |
| TW | 202100809 | 1/2021 |

* cited by examiner

*Primary Examiner* — Louis J Rufo
(74) *Attorney, Agent, or Firm* — JCIPRNET

(57) ABSTRACT

An electroplating apparatus includes an anode and a cathode, a power supply, a regulating plate, and a controller. The power supply is electrically connected to the anode and the cathode. The regulating plate is disposed between the anode and the cathode. The regulating plate includes an insulation grid plate and a plurality of wires. The controller is electrically connected to the plurality of wires to control a state of an electromagnetic field around the plurality of wires. An electroplating method is also provided.

10 Claims, 3 Drawing Sheets

ELECTROPLATING APPARATUS AND ELECTROPLATING METHOD

CROSS-REFERENCE TO RELATED APPLICATION

This application claims the priority benefits of U.S. provisional application Ser. No. 63/255,438, filed on Oct. 14, 2021, and Taiwan application serial no. 111109527, filed on Mar. 16, 2022. The entirety of each of the above-mentioned patent applications is hereby incorporated by reference herein.

BACKGROUND OF THE INVENTION

Field of the Invention

The invention relates to an apparatus and a method, and more particularly, to an electroplating apparatus and an electroplating method.

Description of Related Art

Electroplating has been widely used in various fields. In addition to being traditionally used as a surface treatment method, it is also used in the production of circuit boards, semiconductor chips, LED conductive substrates, semiconductor packaging, and the like. However, electroplating often has issues in electroplating thickness uniformity of the metal coating.

For example, such as in the production process of circuit boards, when the electric lines of force between the anode and the cathode are close to the substrate to be plated, the electric lines of force are often affected by the characteristics of the upper film layer (such as insulation characteristics or other characteristics affecting electric field distribution) thereof and turned, resulting in uneven distribution of electric line of force density. As a result, the metal coating formed on the substrate to be plated has the issue of poor electroplating thickness uniformity.

SUMMARY OF THE INVENTION

The invention provides an electroplating apparatus and an electroplating method that may alleviate the issue of poor electroplating thickness uniformity of a metal coating on a substrate to be plated and achieve better operating freedom.

An electroplating apparatus of the invention includes an anode and a cathode, a power supply, a regulating plate, and a controller. The power supply is electrically connected to the anode and the cathode. The regulating plate is disposed between the anode and the cathode. The regulating plate includes an insulation grid plate and a plurality of wires. The controller is electrically connected to the plurality of wires to control a state of an electromagnetic field around the plurality of wires.

In an embodiment of the invention, the insulation grid plate has an opposite first surface and second surface, the first surface is close to the anode, and the plurality of wires are disposed on the first surface.

In an embodiment of the invention, the plurality of wires are regularly arranged on the insulation grid plate.

In an embodiment of the invention, the plurality of wires are disposed at a junction of line segments of the insulation grid plate.

In an embodiment of the invention, the plurality of wires are bonded onto the insulation grid plate via an adhesive.

In an embodiment of the invention, an extending direction of each of the wires is the same.

In an embodiment of the invention, each of the wires is extended between the insulation grid plate and the anode.

In an embodiment of the invention, there is a distance between all adjacent wires.

In an embodiment of the invention, the regulating plate does not have a magnetic substance thereon.

In an embodiment of the invention, the magnetic substance includes a magnet, a magnetic material, or a combination thereof.

An electroplating method of the invention at least includes the following steps. An electroplating apparatus is provided, wherein the electroplating apparatus includes an anode and a cathode, a power supply, a regulating plate, and a controller. The power supply is electrically connected to the anode and the cathode. The regulating plate is disposed between the anode and the cathode. The regulating plate includes an insulation grid plate and a plurality of wires. The controller is electrically connected to the plurality of wires. A substrate to be plated is fixed on the cathode, wherein the substrate to be plated includes a dry film, the dry film has at least a first opening and a second opening, and the first opening is smaller than the second opening. After the power supply supplies a power, a plurality of electric lines of force moving from the anode to the cathode are formed. The controller controls a state of an electromagnetic field around the plurality of wires to change an incident angle of the plurality of electric lines of force passing through the regulating plate relative to the substrate to be plated, such that a number of the electric lines of force entering the first opening is less than a number of the electric lines of force entering the second opening. A metal coating is formed on the substrate to be plated.

In an embodiment of the invention, the plurality of electric lines of force are moved linearly before passing through the regulating plate, and the plurality of electric lines of force show a spiral movement after passing through the regulating plate.

In an embodiment of the invention, the first opening has a first opening angle, the second opening has a second opening angle, the first opening angle is less than the second opening angle, the incident angles of the lines of force entering the first opening are all less than or equal to the first opening angle, and the incident angles of the lines of force entering the second opening are all less than or equal to the second opening angle.

In an embodiment of the invention, the controller controls a current intensity of the plurality of wires to control the state of the electromagnetic field.

In an embodiment of the invention, during a forming of the metal coating, the controller controls the current intensity of the plurality of wires repeatedly.

In an embodiment of the invention, the current intensity of each of the wires is different.

In an embodiment of the invention, a current direction of the plurality of wires is the same as a moving direction of the plurality of electric lines of force before passing through the regulating plate.

In an embodiment of the invention, the current direction of the plurality of wires is toward the cathode.

In an embodiment of the invention, there is no magnetic field generated by a magnetic substance around the regulating plate.

In an embodiment of the invention, the magnetic substance includes a magnet, a magnetic material, or a combination thereof.

Based on the above, the electroplating apparatus of the invention has the design of a regulating plate between the anode and the cathode, and the controller thereof may control the state of the electromagnetic field around the plurality of wires on the regulating plate, in order to change the incident angle of the electric lines of force passing through the regulating plate relative to the substrate to be plated (via the action of the Lorentz force generated between the electric lines of force and the regulating plate), such that the number of the electric lines of force entering an opening of a smaller size is less than the number of the electric lines of force entering an opening of a larger size. Since the number of the electric lines of force (the driveable metal ion concentration) is positively related to the thickness of the metal coating formed, the number of the electric lines of force entering the opening may be effectively controlled, so that the portion on the substrate to be plated where a circuit is to be formed has a consistent electric line of force density. Therefore, the issue of poor electroplating thickness uniformity of the metal coating on the substrate to be plated is alleviated and better operating freedom is achieved.

In order to make the aforementioned features and advantages of the disclosure more comprehensible, embodiments accompanied with figures are described in detail below.

DESCRIPTION OF THE EMBODIMENTS

Figure 1A:
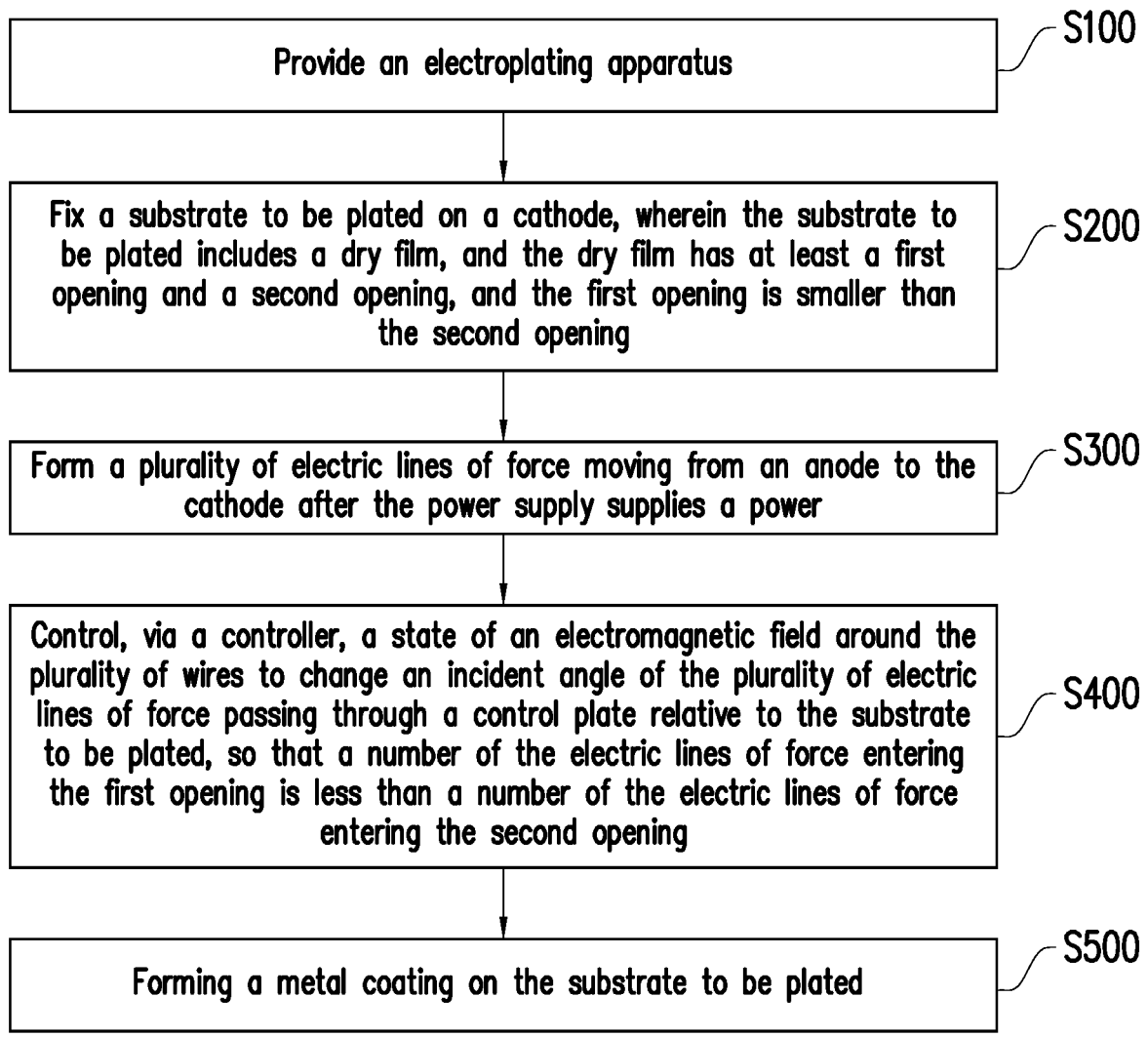
FIG. 1A is a flowchart of an electroplating method according to an embodiment of the invention.

In the following, exemplary embodiments of the invention are comprehensively described with reference to figures, but the invention may also be implemented in various different forms and should not be construed as limited to the embodiments of the specification. In the figures, for clarity, the size and thickness of each region, portion, and layer do not need to be shown to actual scale. For ease of explanation, the same devices below are provided with the same reference numerals.

The invention is more comprehensively described with reference to the figures of the present embodiments. However, the invention may also be implemented in various different forms, and is not limited to the embodiments in the present specification. The thickness, size, or dimensions of layers or regions in the drawings may be exaggerated for clarity. The same or similar reference numerals represent the same or similar elements and are not repeated in the following paragraphs.

Directional terms (e.g., up, down, right, left, front, back, top, bottom) as used herein are used for reference only as shown in the drawings and are not intended to imply absolute orientation.

It should be understood that, even though terms such as "first", "second", "third", etc., in the specification may be used herein to describe various components, members, regions, layers, and/or parts, these components, members, regions, and/or parts should not be limited by these terms. These terms are only used to distinguish one device, member, region, layer, or part from another device, member, region, layer, or part.

Unless otherwise stated, all of the terminology used in the present specification (including technical and scientific terminology) have the same definition as those commonly understood by those skilled in the art of the invention.

Figure 1B:
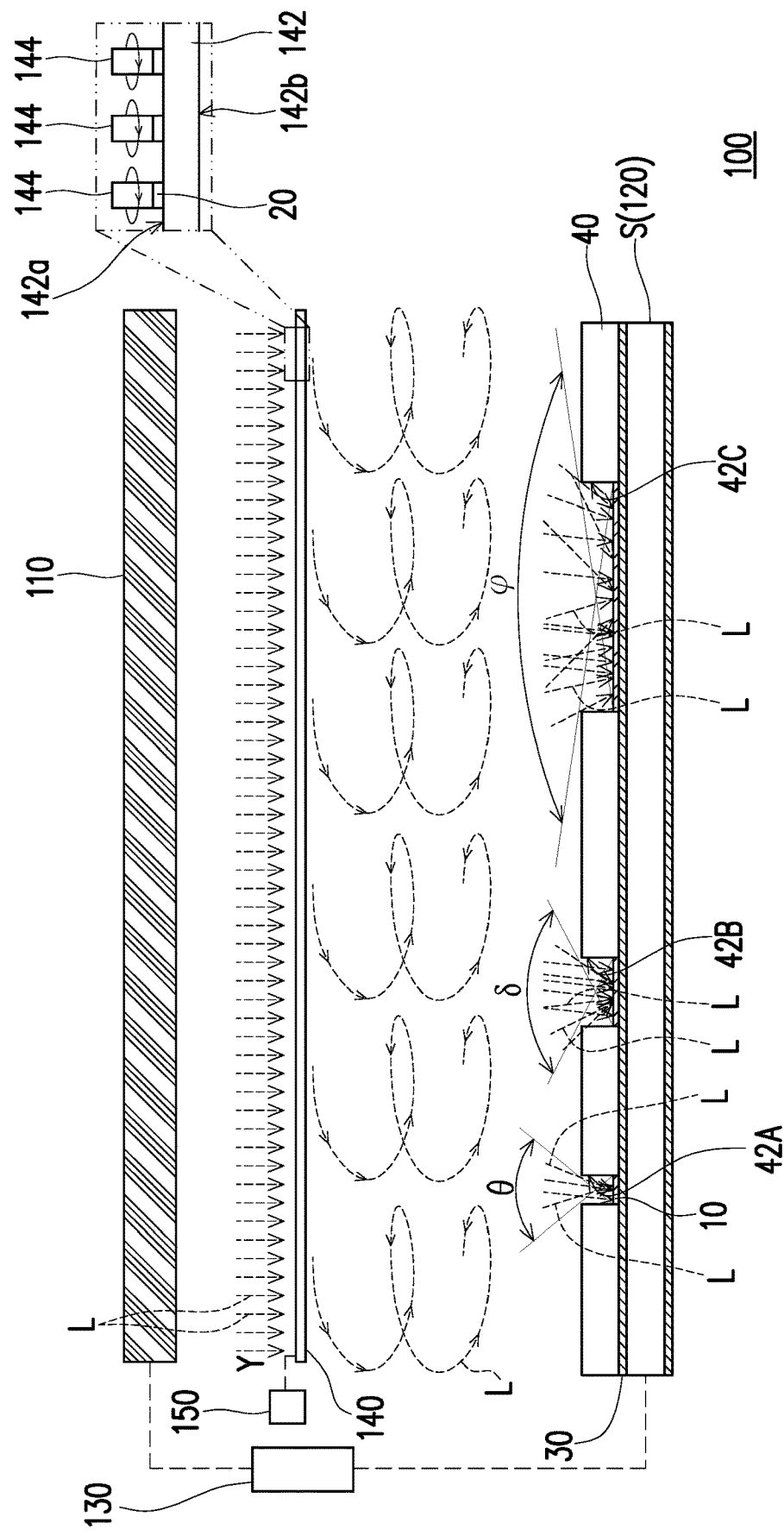
FIG. 1B is a schematic side view of an electroplating apparatus of an embodiment of the invention.
Figure 1C:
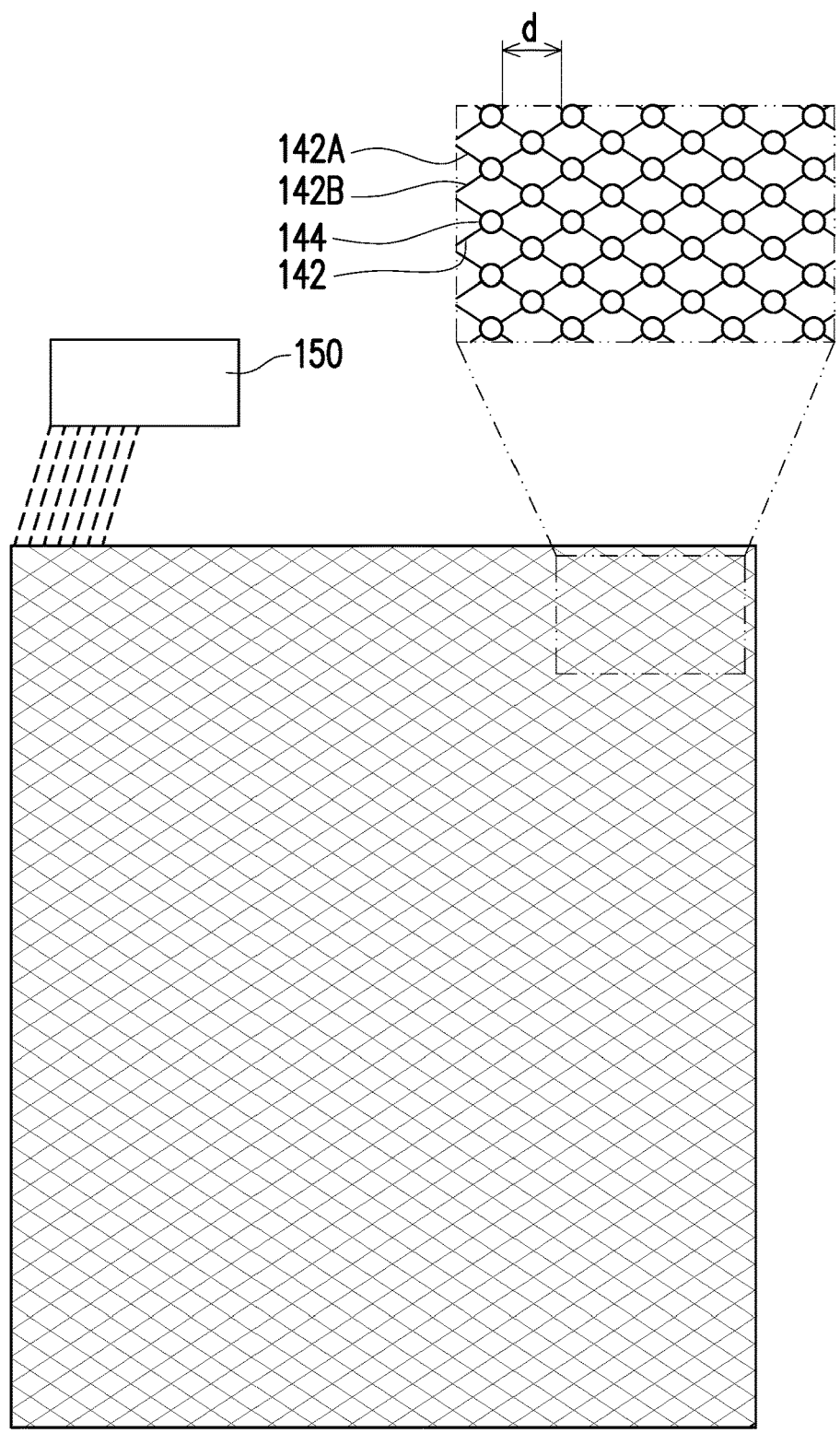
FIG. 1C is a schematic top view of a regulating plate of an electroplating apparatus of an embodiment of the invention.

FIG. 1A is a flowchart of an electroplating method according to an embodiment of the invention. FIG. 1B is a schematic side view of an electroplating apparatus of an embodiment of the invention. FIG. 1C is a schematic top view of a regulating plate of an electroplating apparatus of an embodiment of the invention.

Please refer to FIG. 1A, FIG. 1B, and FIG. 1C, the following describes the main flow of the electroplating method of an embodiment of the invention via the drawings. First, an electroplating apparatus 100 is provided (step S100), wherein the electroplating apparatus 100 includes an anode 110 and a cathode 120, a power supply 130, a regulating plate, 140 and a controller 150. More specifically, the power supply 130 is electrically connected to the anode 110 and the cathode 120, the regulating plate 140 is disposed between the anode 110 and the cathode 120 (one regulating plate 140 is schematically shown between the anode 110 and the cathode 120 in FIG. 1B), wherein the regulating plate 140 includes an insulation grid plate 142 and a plurality of wires 144, and the controller 150 is electrically connected to the plurality of wires 144.

In addition, the electroplating apparatus 100 may further include an electrolytic cell (not shown) containing an electrolyte (including a metal ion Y to be plated), and both the anode 110 and the cathode 120 are disposed in the electrolytic cell. Here, the materials and types of the electrolytic cell, the electrolyte, the anode 110, and the cathode 120 may be adjusted according to the type of the actual metal to be plated (e.g., copper plating), which is not limited in the invention. It should be noted that other specific details of the electroplating apparatus 100 will be further described below.

Next, a substrate S to be plated is fixed on the cathode 120, wherein the substrate S to be plated includes a dry film 40, the dry film 40 has at least a first opening 42A and a second opening 42B, and the first opening 42A is smaller than the second opening 42B (step S200). Here, the material of the dry film 40 is, for example, an insulating material, and the thickness thereof may be determined according to actual design requirements. Then, the power supply 130 supplies power to form a plurality of electric lines of force L moving from the anode 110 to the cathode 120 (which may be the moving direction of electrons released after the anode 110 is electrically conducted) (step S300). Moreover, the controller 150 controls the state of the electromagnetic field around the plurality of wires 144 to change the incident angle of the plurality of electric lines of force L passing through the regulating plate 140 relative to the substrate S to be plated, such that the number of the electric lines of force L entering the first opening 42A is less than the number of the electric lines of force L entering the second opening 42B (step S400). Then, a metal coating 10 is formed on the substrate S to be plated (step S500). Here, "around" may be defined by the current magnetic effect phenomenon (electromagnetic field) in which a magnetic field is generated around the wires 144 after electrical conduction, and the direction of the magnetic field generated by the wires 144 may be determined by Ampere's right-hand rule, as shown by the direction of rotation around the wires in FIG. 1B.

Based on the above, the electroplating apparatus 100 of the present embodiment has the design of the regulating plate 140 between the anode 110 and the cathode 120, and the controller 150 thereof may control the state of the electromagnetic field around the plurality of wires 144 on the regulating plate 140, in order to change the incident angle of the electric lines of force L passing through the regulating plate 140 relative to the substrate S to be plated (via the action of the Lorentz force generated between the electric lines of force L and the regulating plate 140), such that the number of the electric lines of force L entering an opening of a smaller size (such as the first opening 42A of FIG. 1B) is less than the number of the electric lines of force L entering an opening of a larger size (such as the first opening 42B of FIG. 1B). Since the number of the electric lines of force L (the driveable metal ion Y concentration) is positively related to the thickness of the metal coating 10 formed, the number of the electric lines of force L entering the opening may be effectively controlled, so that the portion on the substrate S to be plated where a circuit is to be formed has a consistent electric line of force density. Therefore, the issue of poor electroplating thickness uniformity of the metal coating on the substrate S to be plated is alleviated and better operating freedom is achieved. It should be noted that, in FIG. 1B, the spiral electric lines of force L after passing through the regulating plate 140 have the same spiral electric lines of force L, which are only schematic representations, and do not represent the spiral angle of the actual spiral electric lines of force L. That is, the spiral electric lines of force L after passing through the regulating plate 140 may be the electric lines of force L having different spiral angles.

Here, the Lorentz force may be expressed as $F=q(E+v\times B)$, wherein F is the Lorentz force, q is the charge of the charged particle, E is the electric field strength, v is the velocity of the charged particle, and B is the magnetic induction intensity. In addition, in the invention, the moving direction of the electric line of force may be regarded as the moving direction of the metal ion Y in the electrolyte. Moreover, the size of the opening may be defined by the line width of the opening. For example, the line width of the first opening 42A may be 20 μm, and the line width of the second opening 42B may be 40 μm, but the invention is not limited thereto.

In some embodiments, the plurality of lines of force L are moved linearly before passing through the regulating plate 140, and the plurality of lines of force L are moved spirally after passing through the regulating plate 140. That is, the plurality of lines of force L may be emitted from the anode 120 in parallel and uniformly, then, after passing through the regulating plate 140, the metal ion Y in the electrolyte is driven in a spiral movement to reach the opening on the substrate S to be plated to form the metal coating 10, but the invention is not limited thereto.

In some embodiments, the current intensity of the plurality of wires 144 is controlled via the controller 150 to control the state of the electromagnetic field. Since the current intensity on the wires 144 directly affects the corresponding magnetic field intensity thereof, thus affecting the magnitude of the Lorentz force, the incident angle of the electric lines of force L passing through the regulating plate 140 with respect to the substrate S to be plated may be controlled by the above design. Here, each of the wires 144 on the insulation grid plate 142 represents an angle at which a corresponding number of positions may be controlled.

In some embodiments, during the forming of the metal coating 10, the controller 150 may control the current intensity of the plurality of wires 144 repeatedly. For example, the repeated control may be to repeatedly change the frequency of the current intensity variation of the wires 144. That is, during the forming of the metal coating 10, for example, the current intensity may be changed 1000 times per second, and the current intensity may be different each time (similar to the frequency modulation concept of alternating current), and the above settings may all be determined according to actual design requirements. Moreover, different current intensities may also be set on different regions, and the current intensity of each of the wires 144 may be different (a portion of the wires 144 are different and some of the wires 144 are the same or all of the wires 144 are completely different). In this way, each of the wires 144 may flexibly operate the frequency of the current intensity variation, and therefore the operating freedom may be better improved via the controller 150, but the invention is not limited thereto, and the controller 150 may also only control the current intensity of each of the wires 144 once, without performing the action of frequency modulation.

In the present embodiment, the first opening 42A has a first opening angle θ, the second opening 42B has a second opening angle δ, the first opening angle θ is smaller than the second opening angle δ, the incident angles of the electric lines of force L entering the first opening 42A are all less than or equal to the first opening angle θ, and the incident angles of the electric lines of force L entering the second opening 42B are all less than or equal to the second opening angle δ. That is to say, the second opening angle δ is larger than the first opening angle θ so that the electric lines of force L of the incident angle in a wider range may be received, but the invention is not limited thereto.

In some embodiments, the substrate S to be plated further includes a third opening 42C. The third opening 42C is larger than the first opening 42A and the second opening 42B, and the controller 150 may also control the state of the electromagnetic field around the plurality of wires 144, in order to change the incident angle of the plurality of electric lines of force L passing through the regulating plate 140 relative to the substrate S to be plated, so that the number of the electric lines of force L entering the third opening 42C is greater than the number of the electric lines of force L entering the first opening 42A and the number of the electric lines of force L entering the second opening 42B. For example, the third opening 42C has a third opening angle φ, the third opening angle φ is larger than the first opening angle θ and the second opening angle δ, and the incident angles of the electric lines of force L entering the third opening 42C are all less than or equal to the third opening angle φ. That is, the third opening angle φ may receive the electric lines of force L with a wider range of incident angles, but the invention is not limited thereto. Here, the line width of the third opening 42C may be 120 μm, but the invention is not limited thereto.

In some embodiments, the portion on the substrate S to be plated where a circuit is to be formed may include a circuit dense area and a circuit open area (not shown), and the issue of poor electroplating thickness uniformity of the metal coating of the circuit dense area is more significant. Therefore, the electroplating apparatus 100 of the present embodiment may more significantly alleviate the issue of poor electroplating thickness uniformity of the metal coating of the circuit dense area of the substrate S to be plated, but the invention is not limited thereto. An improvement effect may also be achieved in the circuit open area.

In some embodiments, the current direction of the plurality of wires 144 is the same as the moving direction of the plurality of lines of force L before passing through the regulating plate 140. For example, the current direction of the plurality of wires 144 is toward the cathode 120, but the invention is not limited thereto.

Specific details of the electroplating apparatus 100 are further described below. The insulation grid plate 142 has an opposite first surface 142a and second surface 142b, the first surface 142a is close to the anode 110, and the plurality of wires 144 are disposed on the first surface 142a. More specifically, the plurality of wires 144 may be regularly arranged on the insulation grid plate 142. For example, as shown in FIG. 1C, the plurality of wires 144 may be disposed at the junctions of the line segments (e.g., line segments 142A and 142B) of the insulation grid plate 142. In addition, the plurality of wires 144 may be bonded onto the insulation grid plate 142 via an adhesive 20, wherein the adhesive 20 may be any suitable adhesive material, which is not limited in the invention.

In some embodiments, each of the wires 144 may be extended in the same direction. For example, each of the wires 144 is extended between the insulation grid plate 142 and the anode 110, but the invention is not limited thereto.

In some embodiments, there is a distance d between all adjacent wires 144, in other words, the adjacent wires 144 are not in contact with each other, but the invention is not limited thereto.

In some embodiments, there is no magnetic substance on the regulating plate 140, wherein the magnetic substance includes a magnet, a magnetic material, or a combination thereof, and therefore there is no magnetic field generated by a magnetic substance around the regulating plate 140, but the invention is not limited thereto.

In some embodiments, the distance between the regulating plate 140 and the substrate S to be plated may be between 2 millimeters (mm) and 8 centimeters (cm), but the invention is not limited thereto.

In some embodiments, the substrate S to be plated may further include a seed layer 30, and therefore the metal coating 10 may be plated on the seed layer 30, but the invention is not limited thereto.

Based on the above, the electroplating apparatus of the invention has the design of a regulating plate between the anode and the cathode, and the controller thereof may control the state of the electromagnetic field around the plurality of wires on the regulating plate, in order to change the incident angle of the electric lines of force passing through the regulating plate relative to the substrate to be plated (via the action of the Lorentz force generated between the electric lines of force and the regulating plate), such that the number of the electric lines of force entering an opening of a smaller size is less than the number of the electric lines of force entering an opening of a larger size. Since the number of the electric lines of force (the driveable metal ion concentration) is positively related to the thickness of the metal coating formed, the number of the electric lines of force entering the opening may be effectively controlled, so that the portion on the substrate to be plated where a circuit is to be formed has a consistent electric line of force density. Therefore, the issue of poor electroplating thickness uniformity of the metal coating on the substrate to be plated is alleviated and better operating freedom is achieved.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. An electroplating method, comprising:
providing an electroplating apparatus, wherein the electroplating apparatus comprises:
an anode and a cathode;
a power supply electrically connected to the anode and the cathode;
a regulating plate disposed between the anode and the cathode, wherein the regulating plate comprises an insulation grid plate and a plurality of wires; and
a controller electrically connected to the plurality of wires;
fixing a substrate to be plated on the cathode, wherein the substrate to be plated comprises a dry film, the dry film has at least a first opening and a second opening, and the first opening is smaller than the second opening;
after the power supply supplies a power, a plurality of electric lines of force moving from the anode to the cathode are formed;
the controller controls a state of an electromagnetic field around the plurality of wires to change an incident angle of the plurality of electric lines of force passing through the regulating plate relative to the substrate to be plated, such that a number of the electric lines of force entering the first opening is less than a number of the electric lines of force entering the second opening; and
forming a metal coating on the substrate to be plated.

2. The electroplating method of claim 1, wherein the plurality of electric lines of force are moved linearly before passing through the regulating plate, and the plurality of electric lines of force show a spiral movement after passing through the regulating plate.

3. The electroplating method of claim 1, wherein the first opening has a first opening angle, the second opening has a second opening angle, the first opening angle is less than the second opening angle, the incident angles of the lines of force entering the first opening are all less than or equal to the first opening angle, and the incident angles of the lines of force entering the second opening are all less than or equal to the second opening angle.

4. The electroplating method of claim 1, wherein the state of the electromagnetic field is controlled by setting a current intensity of the plurality of wires.

5. The electroplating method of claim 4, wherein the controller controls the current intensity of the plurality of wires repeatedly during a forming of the metal coating.

6. The electroplating method of claim 4, wherein the current intensity of each of the wires is different.

7. The electroplating method of claim 1, wherein a current direction of the plurality of wires is the same as a moving direction of the plurality of electric lines of force before passing through the regulating plate.

8. The electroplating method of claim 1, wherein a current direction of the plurality of wires is toward the cathode.

9. The electroplating method of claim 1, wherein there is no magnetic field generated by a magnetic substance around the regulating plate.

10. The electroplating method of claim 9, wherein the magnetic substance comprises a magnet, a magnetic material, or a combination thereof.

* * * * *